United States Patent
Bartenstein et al.

(10) Patent No.: US 7,496,816 B2
(45) Date of Patent: Feb. 24, 2009

(54) ISOLATING THE LOCATION OF DEFECTS IN SCAN CHAINS

(75) Inventors: Thomas W. Bartenstein, Owego, NY (US); Joseph Swenton, Owego, NY (US); David Sliwinski, Vestal, NY (US)

(73) Assignee: Cadence Design System, Inc., San Jose, CA (US)

( * ) Notice: Subject to any disclaimer, the term of this patent is extended or adjusted under 35 U.S.C. 154(b) by 64 days.

(21) Appl. No.: 11/385,534

(22) Filed: Mar. 20, 2006

(65) Prior Publication Data

US 2007/0220384 A1  Sep. 20, 2007

(51) Int. Cl.
*G01R 31/28* (2006.01)

(52) U.S. Cl. ...................................................... 714/726
(58) Field of Classification Search ................. 714/726
See application file for complete search history.

(56) References Cited

U.S. PATENT DOCUMENTS

| | | | | |
|---|---|---|---|---|
| 5,189,365 A | * | 2/1993 | Ikeda et al. ................... | 714/33 |
| 5,663,967 A | * | 9/1997 | Lindberg et al. ............ | 714/737 |
| 6,694,454 B1 | * | 2/2004 | Stanley ........................ | 714/30 |
| 2003/0131294 A1 | * | 7/2003 | Motika et al. ................ | 714/718 |
| 2005/0229057 A1 | * | 10/2005 | Anderson et al. ........... | 714/726 |
| 2007/0011523 A1 | * | 1/2007 | Burdine et al. .............. | 714/726 |

* cited by examiner

*Primary Examiner*—James C Kerveros
(74) *Attorney, Agent, or Firm*—Orrick, Herrington & Sutcliffe LLP

(57) ABSTRACT

A system and method for isolating defects in scan chains by performing diagnostics fault simulation on chosen faults that are consistent with the nature of a scan chain defect, while keeping information about predictable failures. The effects of defects at specific locations on the scan chain are modeled by compositing the effects of a subset of the faults for each defect. Each composite, which models a specific scan chain defect, is evaluated in terms of how well it predicts the failures measured at a tester, and assigned a score based on that evaluation. The composite with the highest score identifies the modeled defect which is the closest to predicting the results measured at the tester, and therefore the location on the scan chain that has the highest probability of containing the actual defect.

26 Claims, 2 Drawing Sheets

ISOLATING THE LOCATION OF DEFECTS IN SCAN CHAINS

FIELD

The present invention relates to testing and diagnosing defects in scan chains and more particularly to isolating the location of defects in scan chains.

BACKGROUND

Managing yield in highly integrated semiconductor designs is a very important problem. Most large chips contain scan chains to support testing the chip and diagnosing problems should those tests fail. Scan chains enable the observation of functional logic in the chip by latching onto results of the functional logic and serially scanning the results out. If the chip is defective and the defect does not affect the scan chains, then traditional diagnostic techniques can be used to isolate the defect and determine the manufacturing or design problem that caused the defect. This problem can often be fixed to prevent future chips from having the same defect. When this process is applied over time, the percentage of good chips from a manufacturing batch can rise, the cost of good chips becomes lower, and the time-to-volume production can be decreased.

However, when a defect on a chip renders one or more of its scan chains nonfunctional, traditional diagnostics techniques fail, and yield management becomes a more difficult process. Given that scan chain logic covers only ten to twenty percent all the logic on a chip, a random defect will break the scan chain only ten or twenty percent of the time, leaving eighty to ninety percent of the chips for which traditional techniques can be applied. However, in the early stages of manufacturing and technology development, where the yield management process is often most important, it is likely that any given chip may be affected by more than one defect. Thus, the percentage of chips which have nonfunctional scan chains becomes higher, possibly up to fifty percent of all chips. At this point, the capability to isolate a defect, even when scan chains are defective, becomes vital.

Although several methodologies have been developed to isolate a defect in a scan chain failure, these methodologies have many drawbacks.

One technique is to fault simulate the entire scan process, and use traditional diagnostic techniques to isolate the failure. The problem with this technique is that fault simulation of the entire scan process is too costly in terms of CPU and elapsed time.

Another technique is to generate special test patterns that are designed to isolate a failure in the scan chain. The problem with this technique is that generation of special test patterns requires special processing that is out of the standard manufacturing process.

Another technique is to perform "good machine" simulation of the non-scan parts of the test, assuming that the defect is at a specific bit, and modifying the values in the scan latches to be consistent with that assumption. The problem with this technique is that performing "good machine" simulation requires guessing where the defect occurs. Multiple simulations are required to identify which guess is the best guess. Since it is not cost-effective to simulate a defect at each bit in the scan chain, heuristics are required to identify the best guess. These heuristics trade off accuracy for run-time. Another deficiency of this technique is that it can typically isolate a defect only down to the path from one scan bit to the next scan bit. Typically, a more granular isolation is required.

Accordingly, there is a need for techniques for isolating defects in scan chains quickly and accurately, and which avoid drawbacks of the prior art.

SUMMARY

The various embodiments disclosed herein provide techniques for isolating the location of defects in scan chains. In an embodiment, faults that are consistent with the nature of a scan chain defect are chosen along the scan path of a scan chain. Diagnostics fault simulation is then performed on the chosen faults without simulating the entire scan operation, while keeping information about the failures that each fault predicts. Once this information is available, the effects of defects at specific locations on the scan chain are modeled by compositing the effects of a subset of the faults for each defect. Each composite, which models a specific scan chain defect, is evaluated in terms of how well it predicts the failures measured at a tester, and assigned a score based on that evaluation. The composite with the highest score identifies the modeled defect which is the closest to predicting the failures measured at the tester. Since each composite models a defect at a specific location on the scan chain, the composite with the highest score identifies the location on the scan chain that has the highest probability of containing the actual defect.

In one embodiment, the effects of a defect at a specific location is modeled by compositing the effects of a subset of stuck-at faults which are located between the location of the defect and the scan-out pin of the scan chain.

The methods and apparatus disclosed herein provides numerous advantages including enabling the quick and accurate isolation of a defect in a scan chain using efficient single pass fault simulation instead of requiring multiple simulation passes. Further, simulation of the entire scan operation is not required, which is cost-prohibitive.

Other systems, methods, features and advantages will be or will become apparent to one with skill in the art upon examination of the following figures and detailed description.

DETAILED DESCRIPTION

Figure 1:
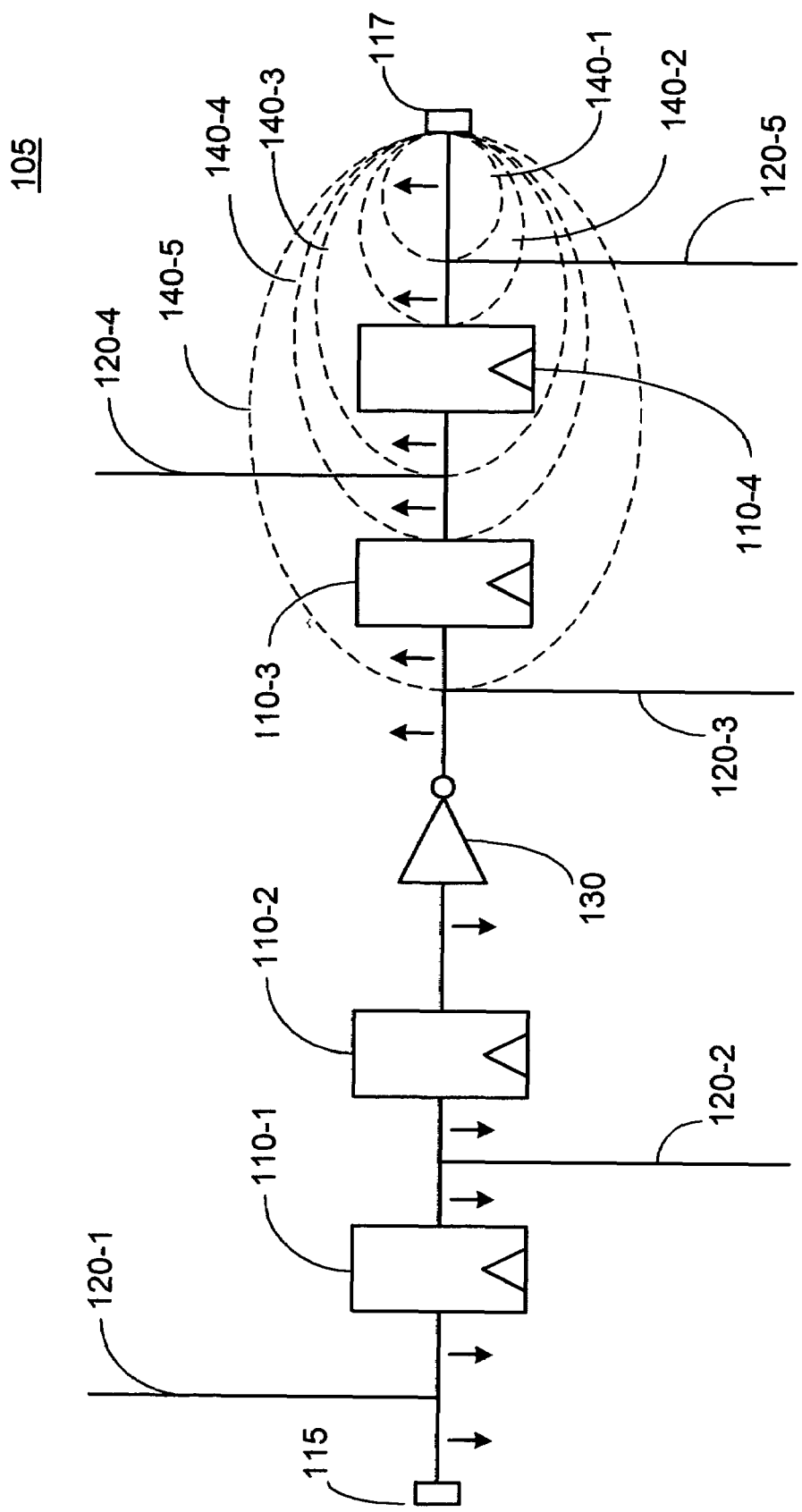
FIG. 1 shows an exemplary scan chain which can be used to isolate defects in the scan chain.

FIG. 1 shows an exemplary scan chain 105, which is typically found in chip circuitry containing internal functional logic and other scan chains. The scan chain 105 comprises a plurality of scan flops 110-1-4, e.g., flip-flops, connected in a chain, a scan-in pin 115 for loading data into the scan chain 105 and a scan-out pin 117 for scanning data out of the scan chain 105. Also shown in FIG. 1 are off scan data paths 120-1-5 for sending data to or from the scan chain 105. The off scan data paths 120-1-5 connect to internal functional logic and/or other scan chains in the chip. The scan chain shown 105 in FIG. 1 is exemplary only, and the inventive concepts described herein can be applied to other types of scan chains.

Figure 2:
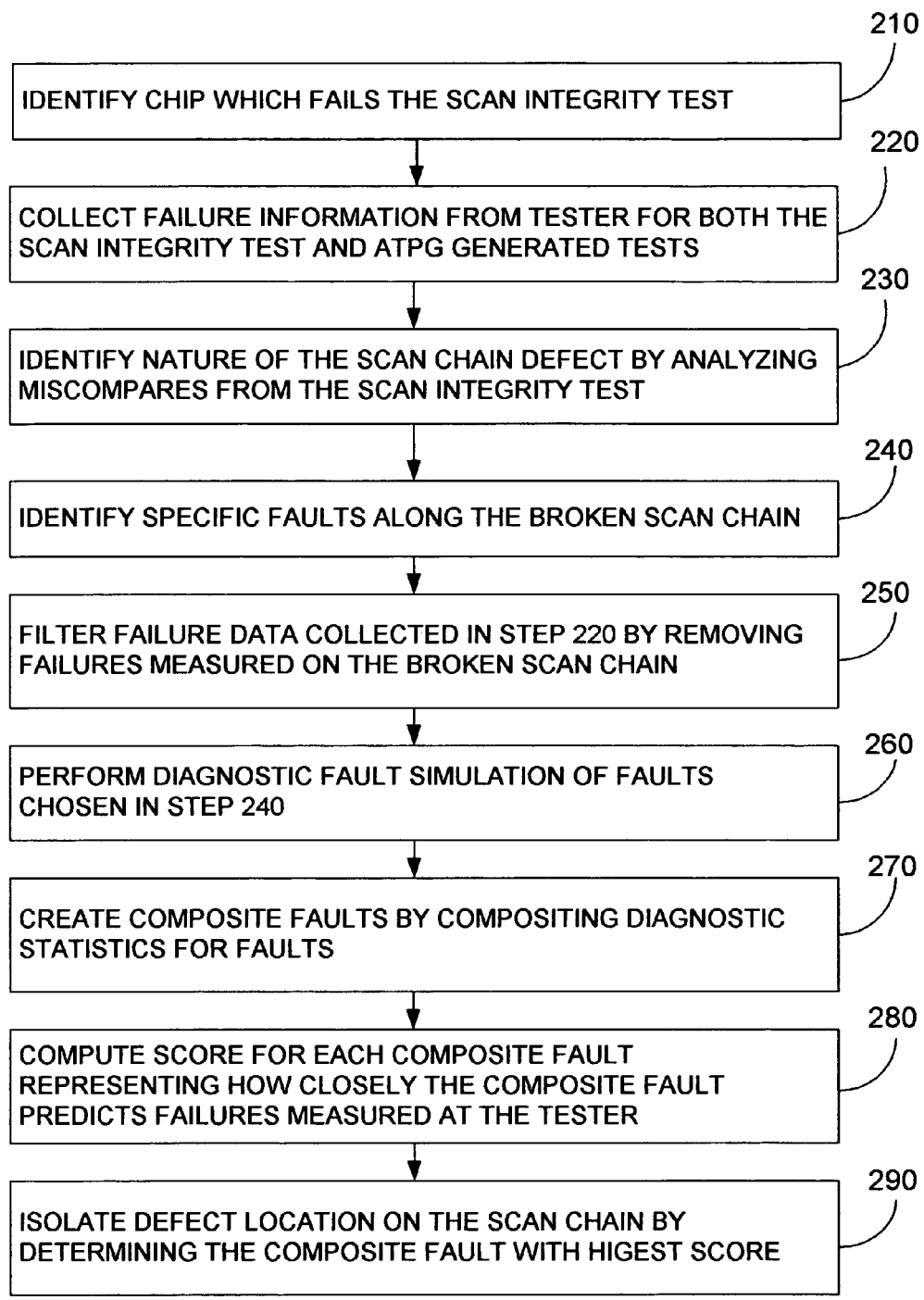
FIG. 2 is a flowchart that describes a method for isolating a defect in a scan chain according to one embodiment.

A method for isolating the location of a defect in a scan chain will now be described with reference to FIG. 2.

In step 210, a chip is identified which fails the scan integrity test, indicating that a defect is present in the scan logic. The scan integrity test may be performed by loading predefined input values, e.g., pairs of ones and zeros, into a scan chain and unloading the scan chain without applying a functional clock to the scan chain. A defect in the scan chain is indicated when the unloaded output values do not match the loaded input values.

In step 220, failure information is collected from a tester for both the scan integrity test, and several standard ATPG (Automatic Test Pattern Generation) generated tests of the chip utilizing the scan chains in the chip.

In step 230, the nature of the scan chain defect is identified by analyzing miscompares from the scan chain integrity test. Specifically, the scan chain which is broken in the chip is identified as well as the nature of the defect. The most straightforward types of defects are stuck-at-one and stuck-at-zero faults, which cause a logic 1 or logic 0 to appear at the scan-out pin of the scan chain for all input test data, respectively. The remaining steps will be describe using the example of stuck-at-one and stuck-at zero faults. However, the concepts decribed herein can be applied to other kinds of defects, as will be discussed later.

In step 240, specific faults along the broken scan chain are identified which are consistent with the nature of the defect. For instance, if the defect causes a logic 1 to appear at the scan out, then stuck-at-one or stuck-at-zero faults will be chosen along the scan path of that scan chain, depending on whether there are an even or odd number of inverters along the scan path between the location of the fault and the scan-out pin. For example, FIG. 1 shows an example of a defect causing a logic 1 to appear at the scan-out pin 117 of scan chain 105. In FIG. 1, stuck-at-one faults (represented by up arrows) are chosen along the scan path in front of the inventor 130. Stuck-at-zero faults (represented by down arrows) are chosen along the path behind the inventor 130 because the inverter 130 is located between these faults and the scan-out pin 117.

In step 250, the failure data collected in step 220 is filtered by removing the failures measured on the broken scan chain itself. The failures measured at the chip output pins and other functional scan chains remain. Because the broken scan chain is connected to internal logic and other scan chains in the chip through the off scan data paths, the effects of faults in the broken scan chain can be detected by failures measured at the chip output pins and other functional scan chains.

In step 260 diagnostic fault simulation is performed using fast fault simulation techniques of the faults chosen in step 240, and the ATPG test patterns for which failure information was collected. Note that traditional fast fault simulation techniques assume that the scan chain is working correctly, and the loading or unloading of the scan chain is not fault simulated. Instead, the simulator assumes that it can insert the scan load values directly in the models of the scan flops along the scan chains during a scan load, and read these values directly from the scan flops during a scan unload.

During the fault simulation of step 260, diagnostic statistics are gathered by keeping track of which failures measured at the tester are consistent with the behavior of each fault simulated, as well as how many other failures the fault predicts which was not measured at the tester. Note that measures on the broken scan chain itself will be ignored (i.e. not count either as consistent with the failures, or as predicted by the faults).

In step 270, "composite" faults are created, which model the behavior of several stuck-at faults simultaneously by compositing the diagnostic statistics for faults starting at the scan-out pin, and creating a composite that consists of faults from the current location on the scan path to the scan-out pin. These composite fault statistics are created by creating a union of the failures explained by each member fault of the composite, and summing the counts of the incorrect predictions of each member fault. The union of the failures explained by each member fault of the composite prevents double counting of failures explained by more than one member fault of the composite. FIG. 1 shows an example of five composites 140-1-5 created at different locations along the scan path starting at the scan-out pin 117. The composite 140-1-5 at each location consists of faults between that location and the scan-out pin 117.

In step 280, a "score" is computed for each composite fault. The score represents how closely the behavior of the composite fault statistics predict the failures measured at the tester. The score consists of the percentage of failures measured at the tester which are consistent with the composite fault, reduced by the number of failures predicted by the composite fault, but which were not measured at the tester.

The score may consist of the following three components:
  a. TF—The total number of failures measured at the tester (minus the failures measured on the broken scan chain, which are filtered out in step 250 above).
  b. TFCP—The number of failures that were both measured at the tester AND predicted by the composite fault.
  c. PCP—The number of failures that were predicted by the composite fault, but were not measured at the tester.

These three components are combined into a single score using the formula:

$$score=100\times[TFCP/(TF+PCP/10)]$$

In step 290, the defect location on the scan chain is isolated by determining the composite fault with the highest score, and mapping that composite to a location on the scan chain. For example, if composite 140-5 in FIG. 1 has the highest score, then the defect is mapped to the location of the fault to the immediate left of scan flop 110-3.

Fast fault simulators and ATPG generators that may be used are available as part of the Cadence Encounter Test software from Cadence Design Systems, Inc. Other ATPG tools that may used include Synopsis Tertramax and Mentor FastScan. The post processing and fault compositing may be performed by a script, which is a computer program typically written in an interpreted language, e.g., Perl or Tcl, and typically used for prototype or custom specific requirements.

An explanation of how defects are isolated in a scan chain will now be given.

A typical ATPG generated test pattern consists of three basic stages. The first stage is to stimulate values into the circuit. This is done by loading the scan chains and chip input pins with known values. The next stage is to pulse a functional clock, which has the effect of taking the stimulated values through the logic of the circuit, and capturing the results of that logic in other latches along the scan chain. The final stage is to unload and measure the values in the scan chain and the chip output pins to determine if the values match the expected values predicted by simulation of the logic.

Typically, such ATPG generated patterns and the logic simulators which created the patterns depend on the fact that the scan chains themselves are working correctly. When the scan chains work correctly, the test generation software can treat each scan latch as an independently stimmable and measurable point on the chip. However, when the scan chains do not work correctly, the assumptions made in the simulator and test generation software no longer hold.

When a single scan chain is broken, the defect which caused the problem can affect all three stages of a typical ATPG test pattern. The defect can cause incorrect values to get loaded into the broken scan chain during the stimulate value stage of the pattern, the defect can cause errors to get captured during the functional clock pulse stage, and the defect can cause incorrect values to get measured during the scan unload and measure stage of the test pattern. All three of these stages are accounted for as follows:

1. During the stimulation and scan-in stage, the defect will cause incorrect values to get loaded in the broken scan chain from the point on the scan chain where the defect is located to the scan-out pin. Even though the scan-in process is not fault simulated, every incorrect value which appears in the latches of the broken scan chain will be modeled by at least one fault on the scan path. Note that the faults that are farther from the scan out pin than the defect will not model any of the miscompares measured at the tester, while at least one of the faults on the scan path between the defect and the scan out pin will model every failure. Hence the composite of all the faults between the defect and the scan out pin should model every failure.

2. During the pulse of the functional clock, each fault is fault simulated, so if the defect caused any incorrect values to get measured, the fault simulation of the fault will predict those miscompares.

3. During the scan unload and measure stage, the defect can affect only the broken scan chain. Since measures on the broken chain are ignored, and since measures predicted by the simulated faults on the broken scan chain are ignored, any effects of the defect during the scan unload and measure process will not contribute either positively or negatively to the results.

Advantages

Exemplary advantages are provided including enabling the quick and accurate isolation of a defect in a scan chain using efficient single pass fault simulation instead of requiring multiple simulation passes. Further, simulation of the entire scan operation is not required, which significantly reduces cost and time. Other advantages include the following:

1. Fault Simulate the entire scan process, and use traditional diagnostic techniques to isolate the failure.

Fault simulation of the entire scan process is too costly in terms of CPU and elapsed time. Fault simulation resources are directly related to the number of clock pulses simulated. Typical ATPG test patterns include a scan load, a single clock pulse, and a scan unload. Fault simulation of the scan load requires simulation of a pulse for each scan cycle. The number of scan cycles depends on the length of the longest scan chain. It is not unusual for a chip to have chains that are thousands of bits long. This makes the fault simulation times increase by at least a thousand times, making this solution cost prohibitive. This extra fault simulation time is not incurred, but yet achieves results that are almost as accurate as fault simulating the entire scan load and scan unload events.

2. Generate special test patterns that are designed to isolate a failure in the scan chain.

Generation of special test patterns requires additional processing that is out of the standard manufacturing process. It can be used on occasion, but not in a production mode. The cost of testing a chip in production is directly related to the number of test patterns that are applied in production. Generation of special tests that target diagnosing scan chain defects would increase the number of test patterns and the associated cost of test higher than the benefit that could be reaped by applying those tests in a production mode in order to be able to quickly diagnose scan chain defects. Therefore, it is not practical to apply scan chain diagnostic patterns in a production test environment. The alternative is to apply existing scan chain integrity tests in a production mode, and, for those chips which fail the scan chain integrity test, applying scan chain diagnostic test patterns. In order to apply these scan chain diagnostic patterns outside of the production flow, the failing chips need to be isolated and handled separately, introducing extra costs in chip production. Scan diagnostics are enabled using only existing production test patterns, and therefore avoids this extra cost.

3. Perform "good machine" simulation of the non-scan parts of the test, assuming that the defect is at a specific bit, and modifying the values in the scan latches to be consistent with that assumption.

Performing "good machine" simulation requires guessing where the defect occurs. Multiple simulations are required to identify which guess is the best guess. One alternative is to perform good machine simulation for each bit on the scan chain. Since scan chains are often thousands of bits long, this implies that thousands of good machine simulations would be required. Since it is not cost-effective to simulate a defect at each bit in the scan chain, heuristics are required to identify the best guess. These heuristics trade off accuracy for runtime. Single pass fault simulation of the patterns is therefore enabled, where a very small percentage of faults are being simulated, i.e., only those along the scan path itself. Therefore, the single pass of fault simulation takes on the order of the same amount of time as a single good machine simulation of the patterns, but gives results for every fault along the scan path. Thus simulation time is significantly reduced while accuracy and the focus of the result over the good machine simulation methodology are improved.

ALTERNATIVE EMBODIMENTS

The methods and apparatus described herein have been described in terms of how to diagnose defects which cause a specific scan chain to be stuck-at zero or stuck-at one. These concepts can be applied to isolating other defect mechanisms as well.

For instance, a scan chain inversion defect, which causes the values at the scan-out to always be opposite from the expected value, can be modeled by compositing both the stuck-at zero AND stuck-at one faults along the scan data path. More complex defect mechanisms exist, and may be modeled by a similar fault composite technique.

Other defects such as low resistance bridges to ground or power on the scan path can be modeled by composites of stuck-at zero or stuck-at one faults. Opens in the scan path due to such process related defects as over etching of signal lines or incomplete vias can be modeled by composites of stuck-at zero or stuck-at one or both stuck-at zero and stuck-at one faults, depending on the circuit topology around the open.

Timing related defects such as flip-flop setup or hold violations can be modeled using a composite of transition faults (slow-to-rise or slow-to-fall faults), with the caveat that a single cycle of the scan process must be included in the fault simulation.

The invention is susceptible to various modifications and alternative forms, and specific examples thereof have been shown by way of example in the drawings and are herein described in detail. It should be understood, however, that the invention is not to be limited to the particular forms or methods disclosed, but to the contrary, the invention is to cover all modifications, equivalents, and alternatives.

What is claimed is:

1. A method for isolating the location of a defect in a scan chain, the scan chain having a scan-in pin and a scan-out pin, comprising:

performing diagnostic fault simulation on a plurality of scan chain faults, wherein the plurality of scan chain faults along a scan path of the scan chain are consistent with a nature of the defect;

gathering statistics for each of said plurality of scan chain faults based on the diagnostic fault simulation, wherein the statistics for each scan chain fault includes failures predicted by the scan chain fault;

creating a composite fault for each of a plurality of locations on the scan chain by compositing the statistics for a subset of the scan chain faults, wherein the composite fault simultaneously models the behavior of the subset of the scan chain faults located between each of the plurality of locations and the scan-out pin of the scan chain; and determining the location of the defect on the scan chain based on which one of the composite faults is closest to predicting failure measurements at a tester.

2. The method of claim 1, wherein the scan chain faults comprise stuck-at faults.

3. The method of claim 1, wherein the subset of scan chain faults for each defect comprises scan chain faults located between the defect and a scan-out pin of the scan chain.

4. The method of claim 3, wherein the scan chain faults comprise stuck-at faults.

5. The method of claim 1, wherein each composite comprises a union of the failures predicted by each one of the scan chain faults of the composite that are consistent with the failure measurements at the tester.

6. The method of claim 5, wherein determining the location of the defect comprises:

assigning a score to each composite based on the number of failures predicted by the composite that are measured at the tester; and determining the location of the defect based on the composite having the highest score.

7. The method of claim 1, wherein the scan chain is in a circuit comprising other scan chains, and the failure measurements at the tester are made on the other scan chains.

8. The method of claim 7, further comprising ignoring failure measurements at the tester made on the scan chain.

9. A method, comprising:

performing a scan integrity test to identify a scan chain having a defect, wherein the scan chain has a scan-in pin and a scan-out pin;

identifying a nature of the defect based on the scan integrity test;

choosing a plurality of scan chain faults along a scan path of the scan chain that are consistent with the identified nature of the defect;

performing diagnostic fault simulation on the plurality of scan chain faults;

gathering statistics for each of said plurality of scan chain faults based on the diagnostic fault simulation; and creating a composite fault by compositing statistics for a subset of the scan chain faults, wherein the composite fault simultaneously models the behavior of the subset of the scan chain faults located between a location in the scan chain and the scan-out pin of the scan chain.

10. The method of claim 9, wherein the defect causes a scan-out pin of the scan chain to be stuck at logic one or logic zero, and the plurality of scan chain faults comprise stuck-at faults.

11. The method of claim 10, wherein the defect causes the scan-out pin to be stuck at logic one, and choosing the plurality of scan chain faults comprises:

choosing a plurality of stuck-at one faults along the scan path, wherein there is an even number of inverters located between each of the stuck-at one faults and the scan-out pin; and choosing a plurality of stuck-at zero faults along the scan path, wherein there is an odd number of inverters located between each of the stuck-at zero faults and the scan-out pin.

12. The method of claim 10, wherein the defect causes the scan-out pin to be stuck at logic zero, and choosing the plurality of scan chain faults comprises:

choosing a plurality of stuck-at zero faults along the scan path, wherein there is an even number of inverters located between each of the stuck-at one faults and the scan-out pin; and choosing a plurality of stuck-at one faults along the scan path, wherein there is an odd number of inverters located between each of the stuck-at zero faults and the scan-out pin.

13. The method of claim 9, wherein performing the scan integrity test comprises:

loading input data into the scan chain;

unloading output data from the scan chain; and identifying the scan chain having the defect when the output data does not match the input data.

14. A computer program product including instructions executed by a computer system, comprising:

instructions for performing diagnostic fault simulation on a plurality of scan chain faults: wherein the plurality of scan chain faults along a scan path of a scan chain are consistent with a nature of a defect in the scan chain;

instructions for gathering statistics for each of said plurality of scan chain faults based on the diagnostic fault simulation, wherein the statistics for each scan chain fault includes failures predicted by the scan chain fault;

instructions for creating a composite fault for each of a plurality of locations on the scan chain by compositing the statistics for a subset of the scan chain faults, wherein the composite fault simultaneously models the behavior of the subset of the scan chain faults located between each of the plurality of locations and the scan-out pin of the scan chain; and instructions for determining the location of the defect on the scan chain based on which one of the composite faults is closest to predicting failure measurements at a tester.

15. The computer program product of claim 14, wherein the scan chain faults comprise stuck-at faults.

16. The computer program product of claim 14, wherein the subset of scan chain faults for each defect comprises scan chain faults located between the defect and a scan-out pin of the scan chain.

17. The computer program product of claim 16, wherein the scan chain faults comprise stuck-at faults.

18. The computer program product of claim 14, wherein each composite comprises a union of the failures predicted by each one of the scan chain faults of the composite that are consistent with the failure measurements at the tester.

19. The computer program product of claim 18, wherein the instructions for determining the location of the defect comprise:

instructions for assigning a score to each composite based on the number of failures predicted by the composite that are measured at the tester; and instructions for determining the location of the defect based on the composite having the highest score.

20. The computer program product of claim 19, wherein the scan chain is in a circuit comprising other scan chains, and the failure measurements at the tester are made on the other scan chains.

21. The computer program product of claim 20, further comprising instructions for ignoring failure measurements at the tester made on the scan chain.

22. A computer program product including instructions executed by a computer system, comprising:
   instructions for performing a scan integrity test to identify a scan chain having a defect, wherein the scan chain has a scan-in pin and a scan-out pin;
   instructions for identifying a nature of the defect based on the scan integrity test;
   instructions for choosing a plurality of scan chain faults along a scan path of the scan chain that are consistent with the identified nature of the defect;
   instructions for performing diagnostic fault simulation on the plurality of scan chain faults;
   instructions for gathering statistics for each of said plurality of scan chain faults based on the diagnostic fault simulation; and
   instructions for creating a composite fault by compositing statistics for a subset of the scan chain faults, wherein the composite fault simultaneously models the behavior of the subset of the scan chain faults located between a location in the scan chain and the scan-out pin of the scan chain.

23. The computer program product of claim 22 wherein the defect causes a scan-out pin of the scan chain to be stuck at logic one or logic zero, and the plurality of scan chain faults comprise stuck-at faults.

24. The computer program product of claim 23, wherein the defect causes the scan-out pin to be stuck at logic one, and the instructions for choosing the plurality of scan chain faults comprise:
   instructions for choosing a plurality of stuck-at one faults along the scan path, wherein there is an even number of inverters located between each of the stuck-at one faults and the scan-out pin; and
   instructions for choosing a plurality of stuck-at zero faults along the scan path, wherein there is an odd number of inverters located between each of the stuck-at zero faults and the scan-out pin.

25. The computer program product of claim 23, wherein the defect causes the scan-out pin to be stuck at logic zero, and the instructions for choosing the plurality of scan chain faults comprise:
   instructions for choosing a plurality of stuck-at zero faults along the scan path, wherein there is an even number of inverters located between each of the stuck-at one faults and the scan-out pin; and
   instructions for choosing a plurality of stuck-at one faults along the scan path, wherein there is an odd number of inverters located between each of the stuck-at zero faults and the scan-out pin.

26. The computer program product of claim 22, wherein the instructions for performing the scan integrity test comprise:
   instructions for loading input data into the scan chain;
   instructions for unloading output data from the scan chain; and
   instructions for identifying the scan chain having the defect when the output data does not match the input data.

* * * * *